CORDWOOD MODULE WITH HEAT SINK FENCE

Filed May 27, 1964 3 Sheets-Sheet 1

INVENTOR.
ROBERT E. KLEIN
JACK GAMMON
BY [signature]
ATTORNEY

CORDWOOD MODULE WITH HEAT SINK FENCE

Filed May 27, 1964 3 Sheets-Sheet 3

United States Patent Office 3,348,101
Patented Oct. 17, 1967

3,348,101

CORDWOOD MODULE WITH HEAT SINK FENCE

Robert E. Klein and Jack Gammon, Fort Wayne, Ind., assignors to International Telephone and Telegraph Corporation, New York, N.Y., a corporation of Delaware Filed May 27, 1964, Ser. No. 370,480
1 Claim. (Cl. 317—100)

This invention relates to the packaging of electronic components and more particularly to packaging for cordwood modules.

Cordwood modules are devices for packaging electrical components in a very small space. Usually, these modules are made from a pair of printed circuit boards positioned in spaced parallel relation. Electronic components are suspended between the boards, usually by having one of their electrodes soldered to one of the boards and the other of their electrodes soldered to the other of the boards.

Primarily, this cordwood construction is used when it is necessary to reduce the size and weight of an electronic device. But this introduces problems because, when so many components are packed together in such a close space, it is hard to dissipate the heat from inside the module. In addition, the modules do not always lend themselves to a variety of types of construction. Components may be long or short, thick or thin, round or square. In addition, some are heat generators, others are not. Some are heat sensitive, others are not. Some use integrated circuitry; some use thin film; some must be tunable. Thus, it should be apparent that cordwood modules do not always lend themselves to economical construction through the use of mass production techniques.

Accordingly, an object of the invention is to provide new and improved cordwood modules.

Another object is to provide cordwood modules having good heat dissipating characteristics.

Yet another object is to provide modules which lend themselves to simple and economical construction despite a wide variance in the types of components used therein. In this connection, an object is to provide standardized parts which may be assembled in almost any unique configurations to give custom designed modules at mass production costs. Finally, an object is to provide a module of standardized parts which may be constructed in one manner to meet low cost civilian requirements, and in another manner to meet the rigorous requirements of the military or space agencies.

In accordance with an aspect of the invention, the cordwood module comprises a heat sink fence having a pair of spaced parallel printed circuit boards staked thereto. The edges of each of these boards are serrated, with each serration adapted to receive and support one of the electrodes or leads of a component. When the components are in position, they are as close as possible to the heat sink which carries away the heat.

The above mentioned and other features of this invention and the manner of obtaining them will become more apparent, and the invention itself will be best understood by reference to the following description of an embodiment of the invention taken in conjunction with the accompanying drawings, in which.

Figure 1:
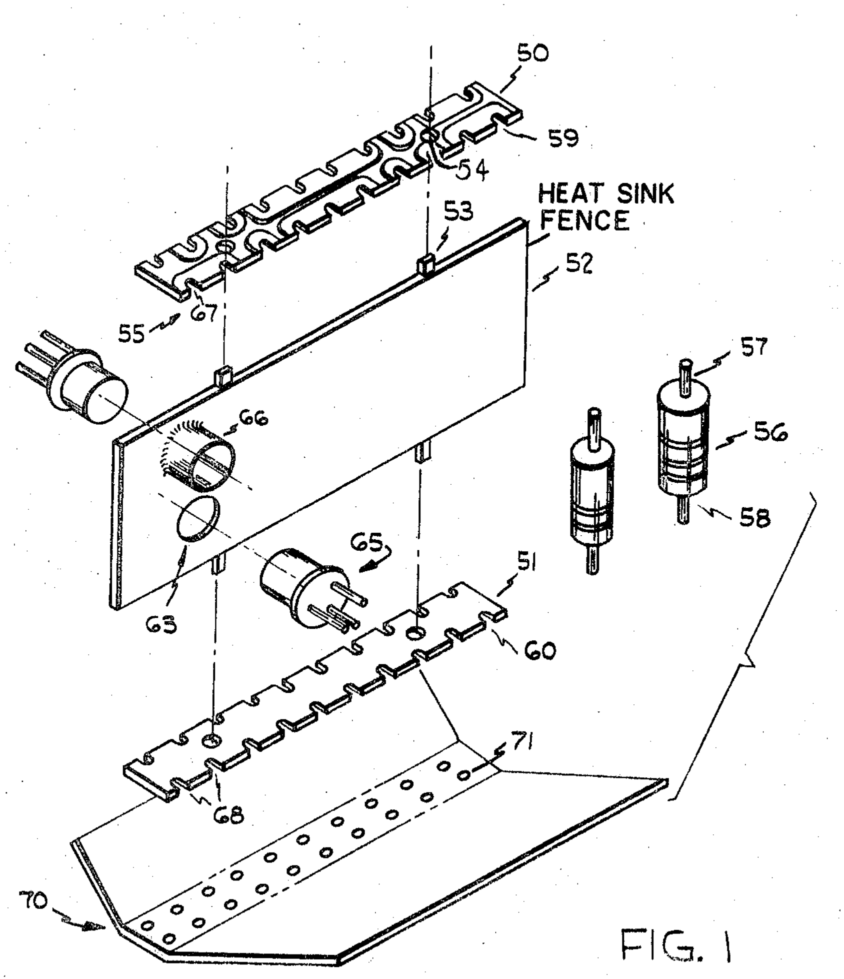
FIG. 1 is an exploded view of a cordwood module constructed in accordance with the teachings of this invention.

The exploded view of FIG. 1 shows the principal parts of the module which are a spaced parallel pair of printed circuit boards and a heat sink fence 52. The upper and lower edges of the fence 52 are shaped to provide a plurality of staking pins, one of which is numbered 53. Each of the printed circuit boards has a staking hole (one of which is numbered 54) formed therein to receive the staking pin. The boards are placed over the staking pins which are then swaged to make a mechanically secure and strong assembly with the boards supported in spaced parallel relation by the fence. Almost any material with good heat conducting characteristics may be used to make the fence; in one exemplary construction, it was an aluminum plate .05″ thick. The criteria for material selection are: light weight, good conductor, good shield, high vaporization temperature at reduced pressures, and standard size pieces readily available at low cost.

The edges of each printed circuit board are serrated (as at 55) with each serration adapted to receive and support the electrode or lead of a component. For example, the component 56 (which could be a resistor, capacitor, or the like) has upper and lower electrodes or leads 57, 58 which fit into serrations 59, 60, respectively. After these components are in place, they are soldered, welded, or otherwise joined to the printed circuit boards 50, 51 in any known manner.

The components should be secured to stand as close as possible to the heat sink fence 52. Sometimes, however, it is preferable to pass the component through a hole in the fence to obtain a more efficient heat transfer. For example, the hole 63 receives the top of the transistor 65. To obtain a still better heat transfer, the rim of the hole may be shaped (as at 66) somewhat like a collar to form a massive metal heat sink.

After the components are in place in or adjacent the fence, their electrodes are bent to fit into appropriate serrations in the printed circuit boards. For example, one electrode of transistor 65 may fit into serration 67 and the other two electrodes may fit into serration 68. This not only provides for easy and inexpensive assembly, but also for easy and inexpensive replacement, if maintenance is required.

The method of mounting the cordwood module may vary in accordance with circuit needs. In an exemplary construction a flexible tape cable 70 was provided with a number of holes (one of which is numbered 71) for receiving the component leads. Thus, the lead 58 passes through the opening 71, and all of the other leads pass through similar holes. This way, the cordwood module becomes an integral part of the tape cable. Of course, this particular cable type of construction is exemplary only, printed circuit cards, connections, or any other suitable device may be provided.

Figure 2:
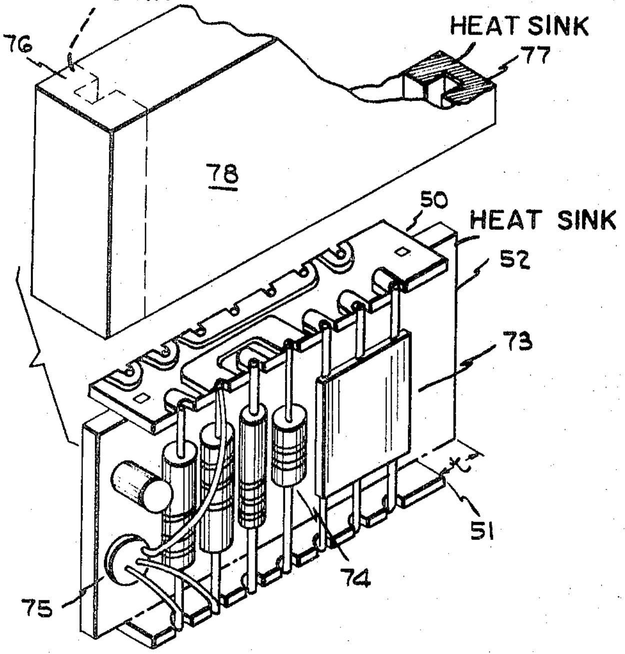
FIG. 2 is a perspective view showing how the module of FIG. 1 looks after it is completely assembled.

After fabrication is completed, the entire cordwood module assembly looks somewhat as shown in FIG. 2. While any components may be used, the drawing shows a rectangular device 73 which might be thought of as either an integrated semiconductor circuit or a thin film circuit, a cylindrical device 74 which could be a resistor, capacitor or diode, and a transistor 75. The fence 52 projects a distance *t* beyond the printed circuit boards 50, 51 to form rails which fit into tracks or guide ways 76, 77 on a cover 78. Hence, the module may be fitted into a cover 78 by sliding the edges of the fence into the tracks 76, 77. In addition to holding the module in position, the tracks 76, 77 provide a further heat sink for dissipating the heat generated by the components. Alternatively, each of the items 77, 76 may be two rails with the fence section *t* clamped therebetween. A criterion for selecting the device which is used depends upon the cold weld effect of the metals. Also, the cover 78 should have good electrical conductive characteristics to provide shielding for the module. Of course, suitable precautions should be taken to prevent a short circuiting of electrical circuits by the cover.

Figures 4A, 4B, 4C, 4D, 4E, 4F:
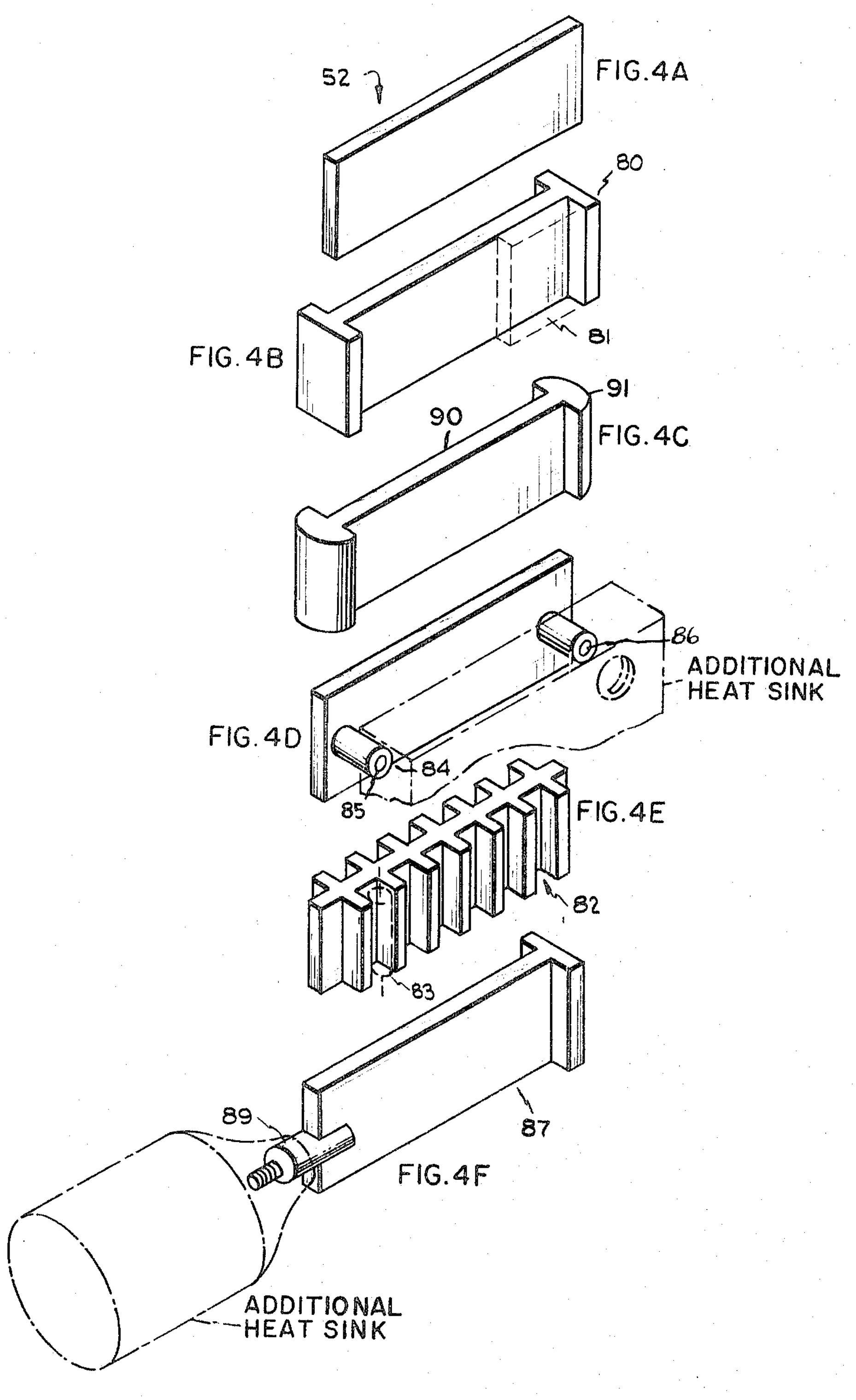
FIGS. 4A–4F show perspective views of the heat sink fences which have the cross sections shown in FIG. 3.

In keeping with the invention, the heat sink fences should be provided in a number of geometrical configurations. This way, mass production economies may be had merely by selecting a fence of a standard shape. Those shapes which might prove most useful are shown in cross section in FIG. 3 and in perspective in FIG. 4. Some, such as 52, are general purpose and provide support for any kind of components. Others, such as 80, provide for the support of rectangular components 81. If this is a thin film or integrated circuit, it should be in intimate contact with the heat sink fence. Others, such as 82, provide individual component holding sections which partially wrap around and collect heat from the components, such as 83. The heat sink fence 84 has two or more upstanding lugs 85, 86 for receiving bolts and thereby supporting an additional massive heat dissipation element. The heat sink fence 87 has a threaded lug 89 to which a massive metal heat sink may be attached as by a nut-and-bolt like construction. Other sink fences such as 90 may support rectangular components, as 80 supports 81, and at the same time employ supports such as 91 having a shape chosen to engage particular tracks or guide ways. The point is that a few standardized piece parts may be combined in any convenient manner to provide custom designed modules at mass production costs.

Figure 5:
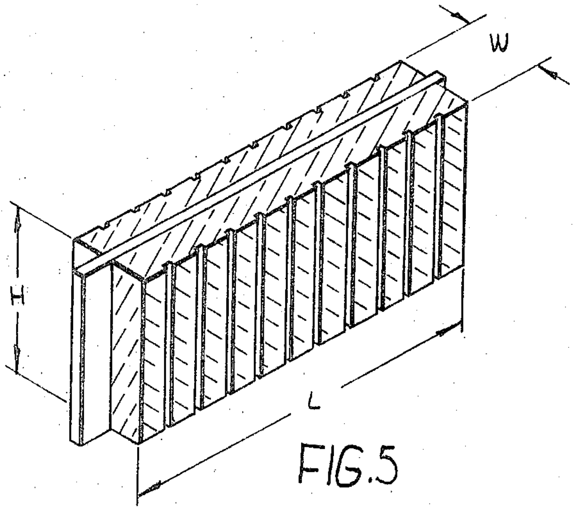
FIG. 5 is a perspective view of a completed cordwood module which has been potted to meet rigorous military or space requirements.
Figure 3A:
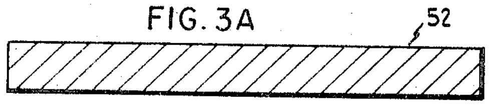
FIGS. 3A–3F show a variety of cross sections which may be used for the heat sink fence.
Figure 3B:
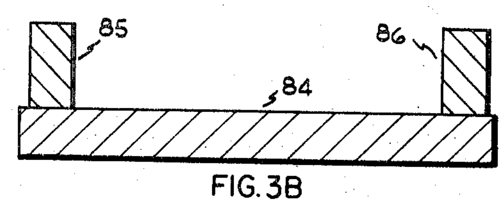
Figure 3C:
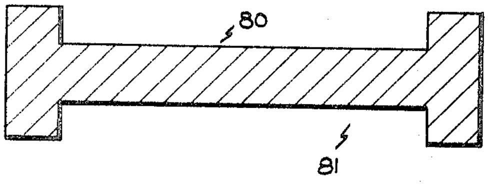
Figure 3D:
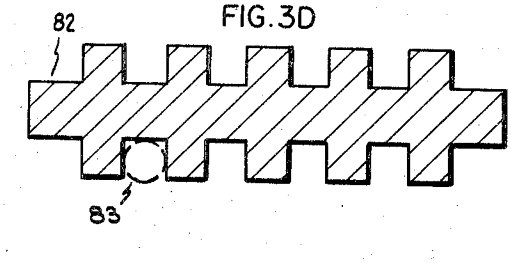
Figure 3E:
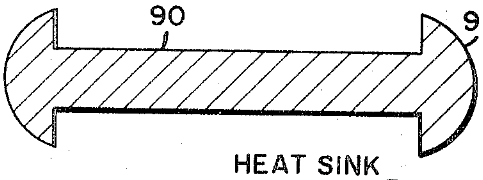
Figure 3F:
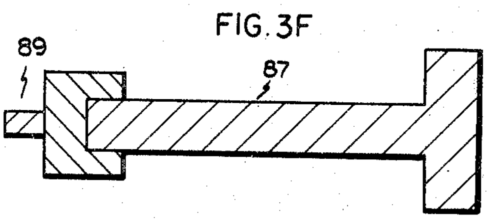

When used in especially hostile environments, the entire cordwood module may be potted, as shown by the hatched areas of FIG. 5. If the potting technique is used in conjunction with the heat sink fence 82, a particularly strong construction results.

In a number of exemplary constructions, the module sizes varied from: $L=.85''$, $W=.21''$, and $H=.25''$, to $L=1''$, $W=.25''$, and $H=.50''$. The weights varied from 7.0 to 7.5 grams. Of course, many other sizes and dimensions are also possible.

While the principles of the invention have been described above in connection with specific apparatus and applications, it is to be understood that this description is made only by way of example and not as a limitation on the scope of the invention.

We claim:

A high density cordwood module comprising a heat sink fence, said fence including a rectangular flat plate of good thermal conductivity having essentially straight edges, a staking pin fastened along each of two parallel edges of said flat plate, a pair of printed circuit boards, each of said boards including at least one staking hole, each of said boards being mounted over one of said staking pins and aligned in spaced parallel relation to the other board, said printed circuit boards having printed circuitry on at least one side, said printed circuit boards including serrated edges, a plurality of electrical components having terminals mounted on the serrated edges of said printed circuit boards, and said fence incorporating a hole and a collar to fit around an additional electrical component, said hole and collar thereby providing means for removing heat from said component.

References Cited

UNITED STATES PATENTS

| | | | |
|---|---|---|---|
| Re. 25,853 | 9/1965 | Van Namen | 317—101 X |
| 2,917,286 | 12/1959 | Deakin. | |
| 2,934,814 | 5/1960 | Williams et al. | 317—101 X |
| 3,010,052 | 11/1961 | Heath et al. | 317—100 X |
| 3,020,451 | 2/1962 | McAdam | 317—101 |
| 3,151,278 | 9/1964 | Elarde | 317—101 |
| 3,200,296 | 8/1965 | Bruestle | 317—100 |
| 3,212,569 | 10/1965 | McAdam | 317—100 X |

OTHER REFERENCES

Electrical Equipment Engineering, June 1962, pp. 17 and 18.

ROBERT K. SCHAEFER, *Primary Examiner.*

KATHLEEN H. CLAFFY, *Examiner.*

W. C. GARVERT, D. SMITH, Jr., *Assistant Examiners.*